US009349738B1

(12) United States Patent
Nataraj et al.

(10) Patent No.: US 9,349,738 B1
(45) Date of Patent: May 24, 2016

(54) CONTENT ADDRESSABLE MEMORY (CAM) DEVICE HAVING SUBSTRATE ARRAY LINE STRUCTURE

(75) Inventors: Bindiganavale S. Nataraj, Cupertino, CA (US); Varadarajan Srinivasan, Los Altos Hills, CA (US)

(73) Assignee: Broadcom Corporation, Irvine, CA (US)

( * ) Notice: Subject to any disclaimer, the term of this patent is extended or adjusted under 35 U.S.C. 154(b) by 1174 days.

(21) Appl. No.: 12/012,663

(22) Filed: Feb. 4, 2008

(51) Int. Cl.
*G11C 15/00* (2006.01)
*H01L 27/11* (2006.01)

(52) U.S. Cl.
CPC ..................................... *H01L 27/11* (2013.01)

(58) Field of Classification Search
CPC ...... G11C 15/04; G11C 15/00; G11C 29/816; G11C 29/785; G11C 7/00; G11C 7/002
USPC ......... 257/202, 206, 208, 209, 211, 503, 758, 257/E27.105, E25.012; 716/16, 17
See application file for complete search history.

(56) References Cited

U.S. PATENT DOCUMENTS

| | | | | |
|---|---|---|---|---|
| 3,531,778 A | * | 9/1970 | Gardner et al. | 365/155 |
| 3,909,808 A | * | 9/1975 | Cochran et al. | 365/104 |
| 4,154,986 A | * | 5/1979 | Howells et al. | 370/376 |
| 4,644,504 A | * | 2/1987 | Mahmood | 365/189.05 |
| 4,939,567 A | * | 7/1990 | Kenney | 257/383 |
| 5,166,771 A | * | 11/1992 | Godinho et al. | 257/368 |
| 5,984,510 A | * | 11/1999 | Guruswamy et al. | 716/2 |
| 5,987,086 A | * | 11/1999 | Raman et al. | 716/1 |
| 6,006,024 A | * | 12/1999 | Guruswamy et al. | 716/12 |
| 6,125,049 A | | 9/2000 | Nataraj | |
| 6,147,891 A | | 11/2000 | Nataraj | |
| 6,209,123 B1 | * | 3/2001 | Maziasz et al. | 716/14 |
| 6,249,467 B1 | * | 6/2001 | Pereira et al. | 365/200 |
| 6,395,592 B1 | * | 5/2002 | Wu | H01L 27/115 257/E21.688 |
| 6,717,831 B2 | * | 4/2004 | Rhee et al. | 365/49.15 |
| 6,842,360 B1 | * | 1/2005 | Srinivasan | 365/49.1 |
| 6,845,024 B1 | * | 1/2005 | Wanzakhade et al. | 365/49.18 |
| 7,071,734 B2 | * | 7/2006 | Kapoor | 326/47 |
| 7,126,837 B1 | | 10/2006 | Banachowicz et al. | |
| 7,187,571 B1 | * | 3/2007 | Lien et al. | 365/49.1 |
| 7,277,309 B1 | | 10/2007 | Banachowicz et al. | |
| 7,286,379 B1 | * | 10/2007 | Sun | 365/49.17 |

(Continued)

OTHER PUBLICATIONS

Chew et al., "Impact of Deep N-well Implantation on Substrate Noise Coupling and RF Transistor Performance for Systems-on-a-Chip Integrate", *European Solid-State Device Research Conference*, 2002, pp. 251-254.

*Primary Examiner* — Vongsavanh Sengdara
(74) *Attorney, Agent, or Firm* — Sterne, Kessler, Goldstein & Fox PLLC

(57) ABSTRACT

A content addressable memory (CAM) device can include a plurality of CAM cells each formed within a cell area of a substrate. Each cell area can have a cell length dimension in a first direction parallel to a substrate surface. The CAM device can also include at least one common line comprising a contiguous region of the substrate doped to a first conductivity type and formed in a base semiconductor region doped to a second conductivity type. The common line can extend in the first direction for more than one cell length and can be commonly coupled to non-power supply connections to the plurality of CAM cells.

18 Claims, 10 Drawing Sheets

(56) References Cited

U.S. PATENT DOCUMENTS

| | | |
|---|---|---|
| 7,319,602 B1 | 1/2008 | Srinivasan et al. |
| 7,446,381 B2 * | 11/2008 | Hashidzume et al. ........ 257/412 |
| 2002/0190323 A1 * | 12/2002 | Aoki .................... H01L 21/84 |
| | | 257/351 |
| 2003/0222293 A1 * | 12/2003 | Noro .................... H01L 27/105 |
| | | 257/296 |
| 2004/0002185 A1 * | 1/2004 | Takahashi ................... 438/224 |
| 2004/0129966 A1 * | 7/2004 | Giuroiu et al. ................ 257/303 |
| 2006/0022243 A1 * | 2/2006 | Hashidzume et al. ........ 257/296 |
| 2006/0060903 A1 * | 3/2006 | Amo .................... G11C 15/043 |
| | | 257/296 |
| 2006/0157818 A1 * | 7/2006 | Williams et al. .............. 257/511 |
| 2006/0171183 A1 * | 8/2006 | Lysinger et al. ................ 365/49 |
| 2007/0183213 A1 * | 8/2007 | Kusakabe et al. ........ 365/185.23 |
| 2007/0207830 A1 * | 9/2007 | Shinohara ......... H04M 1/72522 |
| | | 455/550.1 |
| 2008/0273396 A1 * | 11/2008 | Kusakabe et al. ........ 365/185.23 |
| 2008/0274586 A1 * | 11/2008 | Matsubara et al. ........... 438/106 |
| 2009/0108360 A1 * | 4/2009 | Smayling et al. ............. 257/368 |

* cited by examiner

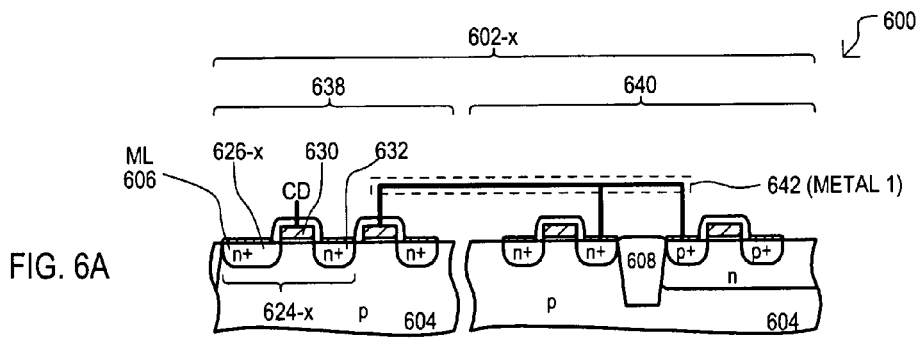
FIG. 6A
FIG. 6B
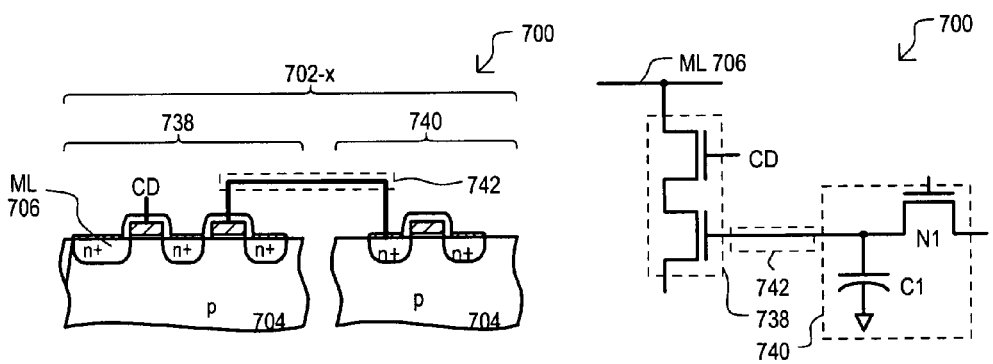
FIG. 7A
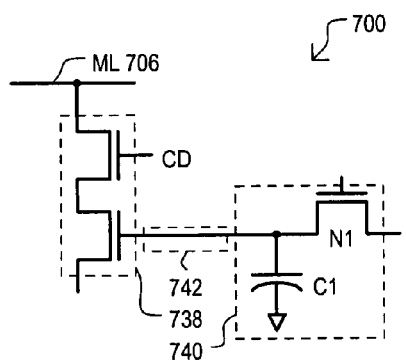
FIG. 7B
| | Substrate | M1 | M2 | M3 | M4 |
|---|---|---|---|---|---|
| CONV. | Trans. | ML | LIC | CD/BCD | BL |
| EMB. | ML/Trans. | LIC | CD/BCD | BL | Other |
FIG. 8
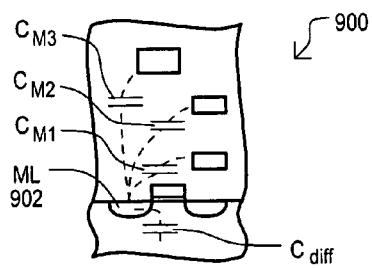
FIG. 9

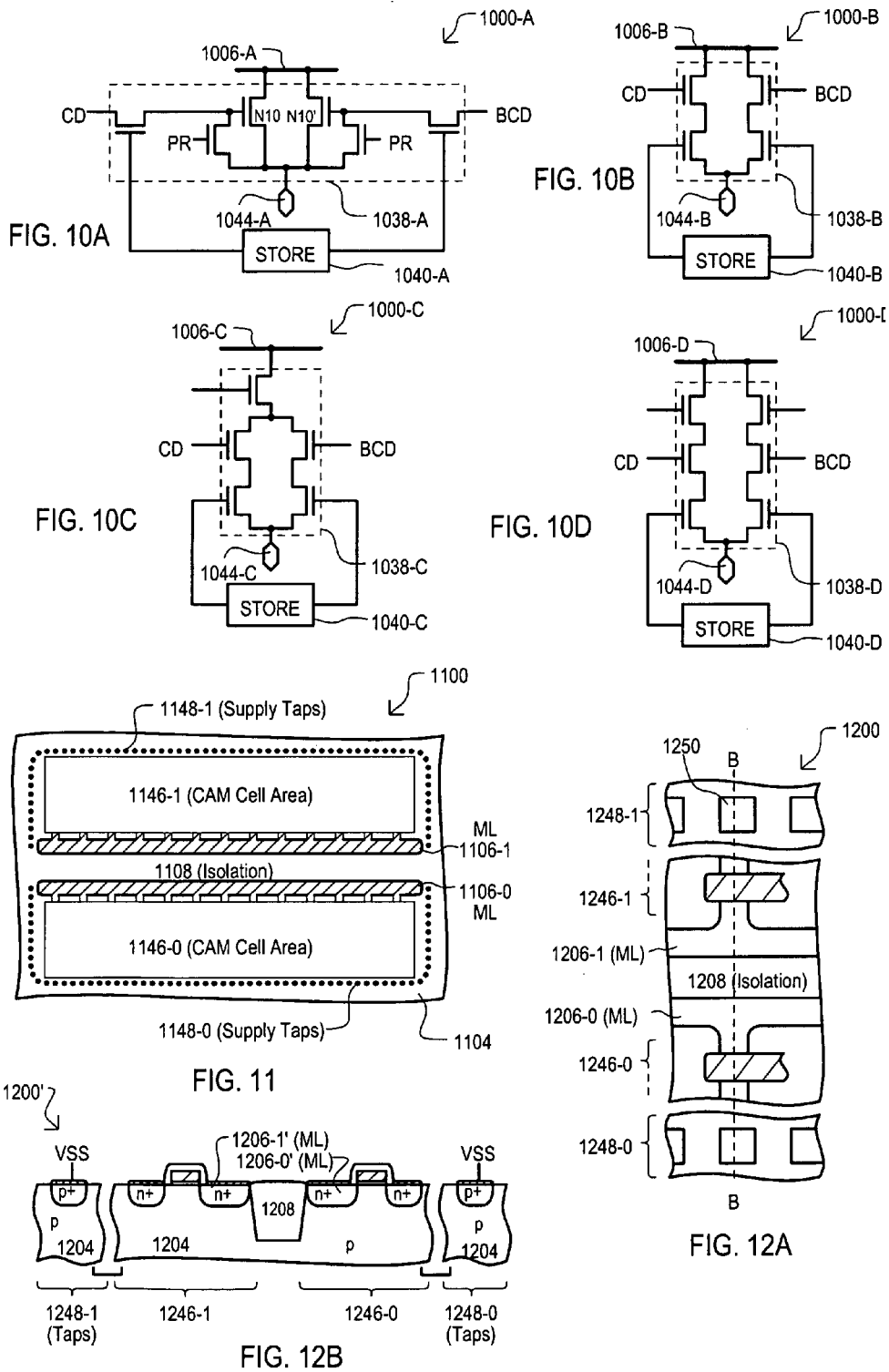

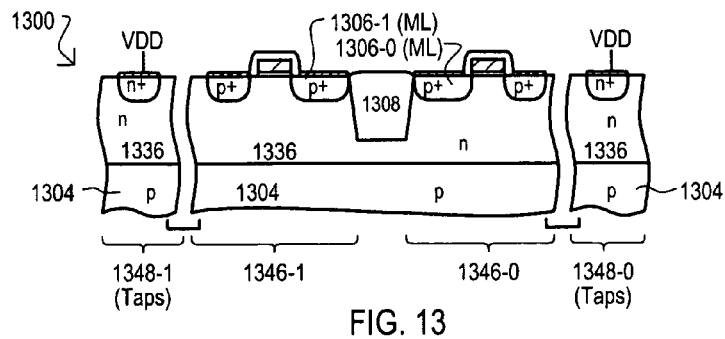
FIG. 13
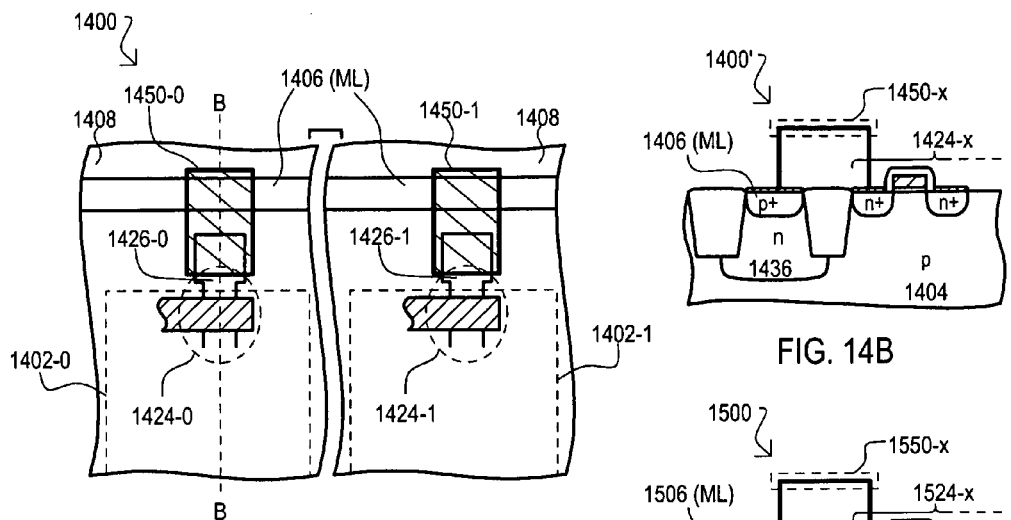
FIG. 14A
FIG. 14B
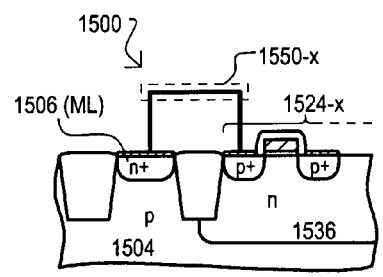
FIG. 15
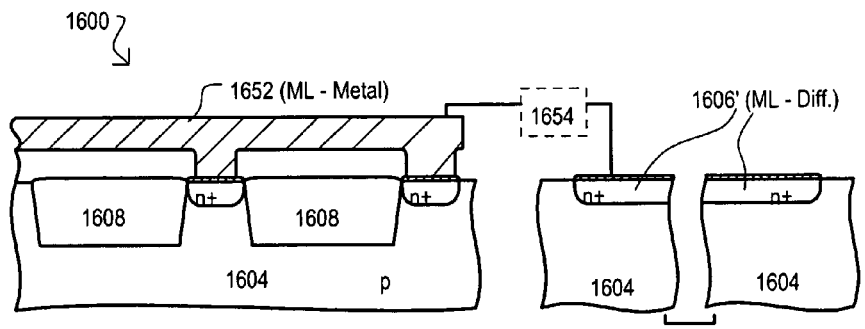
FIG. 16

CONTENT ADDRESSABLE MEMORY (CAM) DEVICE HAVING SUBSTRATE ARRAY LINE STRUCTURE

TECHNICAL FIELD

The present invention relates generally to content addressable memory (CAM) devices, and more particularly to CAM devices having common connections between multiple CAM cells.

BACKGROUND OF THE INVENTION

Content addressable memory (CAM) devices, sometimes referred to as "associative memories," can receive a compare data value (in some cases referred to as a comparand or search key), and compare such a value against a number of stored data values. In most configurations, such an operation can match a compare data value against a very larger number of stored data values (e.g., thousands or millions), essentially simultaneously.

Such rapid compare functions have resulted in CAM devices enjoying wide application in various packet processing hardware devices, such as routers and network switches, to name just two. In a typical packet processing operation, a device can receive a packet. The packet can include various data fields that indicate how the packet should be processed or what the data packet contains. A hardware device can use a matching function, provided by a CAM device, to compare one or more data fields to stored data values and thereby indicate how the packet is to be processed.

Many CAM device configurations can include a number of CAM memory cells arranged into an array of rows and columns. CAM cells of a same row can be commonly connected to a match line, that can provide a match result representing a comparison between data values stored in the row, and a received compare data value. CAM cells of a same column can be commonly connected to a bit line pair, in order to read and/or write data to CAM cells of the column. Similarly, CAM cells of a same column can be commonly connected to compare data lines that can provide a compare data value to the CAM cells of the column.

To better understand various aspects of the embodiments, a conventional CAM device circuit will now be described.

Referring now to FIG. 26A, an example of a conventional CAM device is shown in a top plan view and designated by the general reference character 2600. A CAM device 2600 can include a substrate 2602 in which can be formed a number of CAM cells. Areas of a substrate occupied by each CAM cell are shown as 2604-0 to 2604-5. FIG. 26A also shows interconnection metallization line 2606 that is formed over substrate 2602 and can includes contacts 2608-0 to 2608-5 to CAM cell areas (2604-0 to 2604-5). A metallization line 2606 can provide a common connection to CAM cells of a CAM device, such as a match line. Successive compare operations typically result in a match line being continuously precharged and then discharged (in the event of a non-match result).

Referring now to FIG. 26B, a side cross sectional view taken along line B-B of FIG. 26A shows metallization line 2606 extending to diffusion regions (one shown as 2610) formed in a p-type substrate 2612.

It is understood that FIGS. 26A and 26B are not drawn to scale, and are intended to show the general placement of structures in one conventional arrangement.

Referring now to FIG. 27, a CAM device, like that shown in FIGS. 26A and 26B is shown in a diagram that illustrates capacitive effects on a match line. FIG. 27 shows a CAM device 2700 having a first match lines 2702-0 and an adjacent second match line 2702-1. Match lines (2702-0 and 2702-1) can be formed by patterning a first metallization layer formed over a substrate. Each match line (2702-0 and 2702-1) has a direct connection to transistors within compare circuits of CAM cells of the same row. This is represented in FIG. 27, by match line 2702-0 being connected to a drain of transistor 2704.

A structure of CAM device 2700 can result in various components contributing the effective capacitance of a match line (2702-0 and 2702-1). FIG. 27 shows such capacitive components for first match line 2702-0 as capacitances $C_{diff}$, $C_{plate}$, $C_{ML}$, $C_{M2}$, $C_{M3}$. Capacitance $C_{diff}$ includes a diffusion capacitance formed at the multiple drain connections to match line 2702-0. Capacitance $C_{plate}$ includes a capacitance presented by the structure of match line 2702-0 itself as a metal "plate" separated from a substrate by insulating layers. Capacitance $C_{ML}$ can be a capacitance due to coupling between match line 2702-0 and adjacent match line 2702-1 (as well as any other adjacent match lines). Capacitance $C_{M2}$ can be a capacitance due to coupling between match line 2702-0 and an overlying second metallization layer 2706. Similarly, capacitance $C_{M3}$ can be a capacitance due to coupling between match line 2702-0 and an overlying third metallization layer 2708.

As in the case of FIGS. 26A and 26B, the structures of FIG. 27 are not drawn to scale, and are intended to represent a general relationship between the structures. If capacitances $C_{ML}$, $C_{M2}$, $C_{M3}$ are commonly grouped into a single value $C_{couple}$, a capacitance for match line 2702-0 can be given as $$Ctot = C_{diff} + C_{plate} + C_{couple}.$$

As noted above, in operation, match lines are typically charged and discharged repeatedly. Keeping in mind the above relationship, a match line power consumption (P) can be proportional to such a capacitance, as shown by the relationship:

$$P \propto Ctot * V^2 * f$$

where V is the switching range voltage for the match line, and f is the frequency of switching. A typical CAM device can include thousands of match lines, thus match line switching (charging and discharging) can be a considerable source of power consumption.

At the same time, the speed by which a match line can be charged can be represented by a time constant ($\tau$) for a match line:

$$\tau = R_{ML} * CtOt$$

where $R_{ML}$ can be a unit resistance for a match line.

Conventionally, to provide a low value of $R_{ML}$ for a match line structure, match lines have been formed with a metallization layer.

BRIEF DESCRIPTION OF THE DRAWINGS

FIGS. 6A and 6B are diagrams of a CAM device having a substrate match line according to an embodiment.

FIGS. 7A and 7B are diagrams of a CAM device having a substrate match line according to another embodiment.

FIG. 8 is a table comparing CAM device integrated circuit layers according to one embodiment and that of a conventional case.

FIG. 9 is a side cross sectional view illustrating capacitance components that can arise with a substrate match line.

FIGS. 10A to 10D show various examples of CAM cells that can be utilized with a substrate match line.

FIG. 11 is a top plan view of a CAM device according to another embodiment.

FIGS. 12A and 12B are two views illustrating one example of a CAM device like that of FIG. 11.

FIG. 13 is a side cross sectional view showing another example of a CAM device like that of FIG. 11.

FIGS. 14A and 14B are two views showing a CAM device according to another embodiment.

FIG. 15 is a side cross sectional view showing another example of CAM device like that of FIG. 14A.

FIG. 16 is a side cross sectional representation of a CAM device according to another embodiment.

DETAILED DESCRIPTION

Various embodiments of the present invention will now be described in detail with reference to a number of drawings. The embodiments include a substrate structure that can provide a common interconnection among content addressable memory (CAM) cells of a CAM cell array, methods for making such structure, and machine manufacturing patterns representing such structures. In one particular embodiment, such a structure can be match line formed by a doped region of a substrate. In other embodiments, such a structure can be a bit line or compare data line formed by a doped region of a substrate.

It is understood that in the various embodiments described below, features are not drawn to scale, and are intended to show the general placement of structures. Particular dimensions can vary according to numerous factors, including process used, CAM memory cell design, CAM array configuration, desired design goals, to name but a few.

Figure 1A:
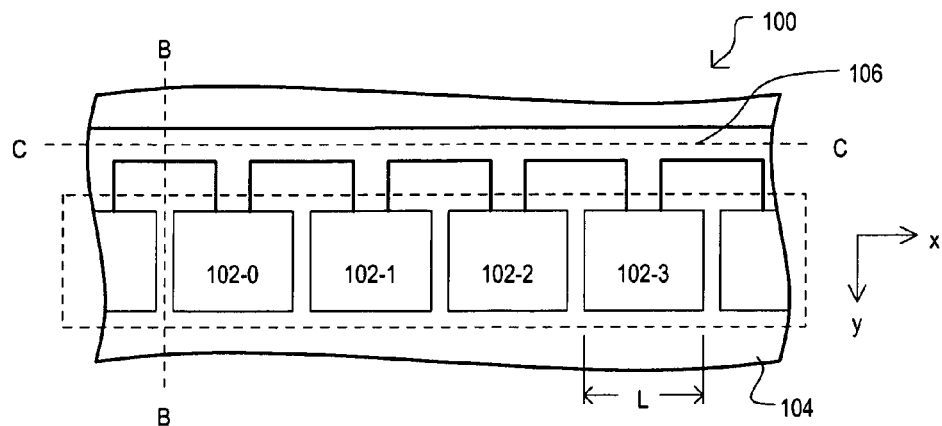
FIGS. 1A to 1C are a series of views showing a content addressable memory (CAM) device according to one embodiment of the invention.
Figure 1B:
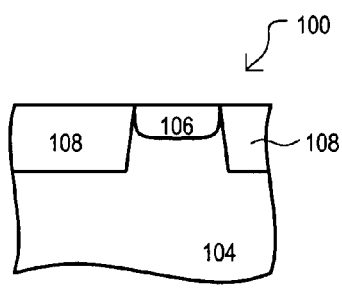
Figure 1C:
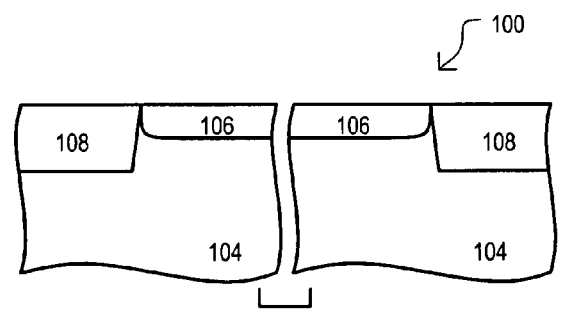

Referring now to FIGS. 1A to 1C, a CAM device according to a first embodiment is shown in a series of views, and designated by the general reference character 100. FIG. 1A shows a top plan view of a CAM device 100. FIG. 1B shows a side cross sectional view of CAM device 100 taken along line B-B of FIG. 1A. FIG. 1C shows a side cross sectional view of CAM device 100 taken along line C-C of FIG. 1A. It is understood that FIGS. 1A to 1C show a substrate level view of a CAM device 100, and such a CAM device can include various additional layers formed over a substrate, including by not limited to additional conductive layers that can connect to a substrate, or can connect to one another by way of contacts or vias.

Referring now to FIG. 1A, a CAM device 100 can include a number of CAM cells 102-0 to 102-3 formed in a semiconductor substrate 104 that are connected to a signal line 106 also formed in substrate 104. In the arrangement of FIG. 1A, CAM cells (102-0 to 102-3) can be generally arranged in one direction (shown by arrow "x"). CAM cells (102-0 to 102-3) can each compare a received compare data value to a stored data value. CAM cells (102-0 to 102-3) can include binary CAM cells, which can provide compare results based only on a comparison between a compare data value and stored data value, ternary CAM cells, which can provide compare results like a binary CAM cell but can further be forced (e.g., masked) to one type of compare result based on a mask value, and "pseudo" ternary CAM cells, in which a masking value is provided to groups of CAM cells, rather than on a cell-by-cell basis. Preferably, each CAM cell (102-0 to 102-3) can include a compare circuit that executes a compare operation between compare data and stored data.

CAM cells (102-0 to 102-3) can have various connections, including power supply connections and non-power supply connections. A power supply connection can provide power to a CAM cell. For example, a CAM cell can have a high power supply connection for receiving a high power supply and a low power supply connection for receiving a low power supply (which in some embodiments can be ground).

According to various embodiments shown herein, a substrate signal line can commonly connect non-power supply connections of CAM cell. A non-power supply connection can provide a signal path for a CAM cell that can carry a signal that may vary between operations of a CAM cell. As but a few examples, non-power supply connections can include compare circuit connections, data connections, or global mask connections, to name but a few. A CAM cell compare circuit connection can provide a compare result for a match operation of the CAM cells. A data connection can provide a read and/or write data path to the CAM cell. For example, a data connection may provide a read/write path for writing data into a CAM cell for comparison with a compare data value, or a read/write path for writing a mask value into a CAM cell. A compare data connection can provide a compare data value to CAM cell, which can be compared to a stored data value. In the case of "pseudo" ternary CAM cells, a global mask connection can provide a global masking value to a CAM cell (e.g., a mask value that is not stored in the CAM cell itself). Of course, a non-power supply connection can include various other types of connections for configuring a CAM cell, or otherwise controlling a CAM cell operation.

Referring still to FIG. 1A, CAM cells (102-0 to 102-3) can each occupy an area of a substrate, shown a series of rectangular areas arranged in the x-direction. However, it is understood that while FIG. 1A shows CAM cells that occupy a generally rectangular area, CAM cell areas can have irregular shapes and/or can be shapes that mirrors an adjacent CAM cell. Similarly, a CAM cell can have a portion that extends into an adjacent CAM cell, and vice versa. An area occupied by a CAM cell (102-0 to 102-3) can have a length in the x-direction. For example, FIG. 1A shows such a length of CAM cell 102-3 by the reference character "L".

Referring again to FIG. 1A, a signal line 106 can be a line that electrically connects CAM cells (102-0 to 102-3) to form a common node with respect to the CAM cells. A signal line 106 can be connected to CAM cells (102-0 to 102-3) at non-power supply connections. As noted above, a signal line 106 can be formed within substrate 106, and thus can differ from a conventional arrangement, like that of FIGS. 26A and 26B, where a match line is formed above a substrate. A signal line 106 preferably has an elongated shape, extending in the x-direction to a much greater extent than the y-direction.

Referring now to FIGS. 1B and 1C, a substrate 104 can be a semiconductor region doped to a particular conductivity type. As but one example, a substrate 104 can be an essentially monocrystalline silicon substrate doped with p-type dopants or alternatively, n-type type dopants. A substrate 104 can be formed as part of a "bulk" portion of a larger semiconductor structure, or can be well of one conductivity type, formed in a region of the opposite conductivity type.

A signal line 106 can formed within substrate 104, and can be a semiconductor region doped to an opposite conductivity type than substrate 104. For example, a signal line 106 and substrate 104 can both be formed in an essentially monocrystalline silicon substrate, with signal line 106 being doped to n-type (or p-type) conductivity, while substrate 104 is doped to p-type (or n-type) conductivity.

FIGS. 1B and 1C show an arrangement in which a signal line 106 can be formed in a "bulk" semiconductor substrate. Thus, isolation structures 108 can be included that provide lateral isolation between signal line 106 and other devices in the substrate 104. However, in alternate embodiments, such as those with a silicon-on-insulator (SOI) type substrate, an isolation layer formed laterally (horizontal in FIGS. 1B and 1C) within a substrate 104 below signal line 106.

In this way, a signal line that commonly connects non-power supply connection of CAM cells to one another can be formed within a substrate containing such CAM cells.

As noted above, a signal line like that shown as 106 can be connected to non-power supply connections of multiple CAM cells. Two possible variations of such an arrangement are shown in FIGS. 2 and 3.

Figure 2:
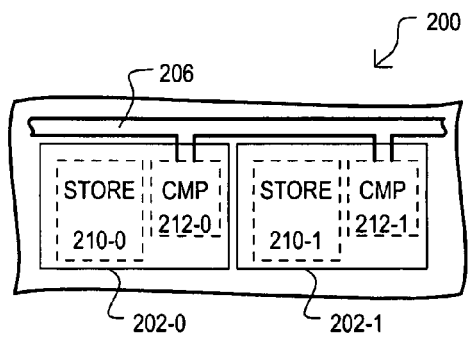
FIG. 2 is a block diagram of a CAM device according to another embodiment.
Figure 3:
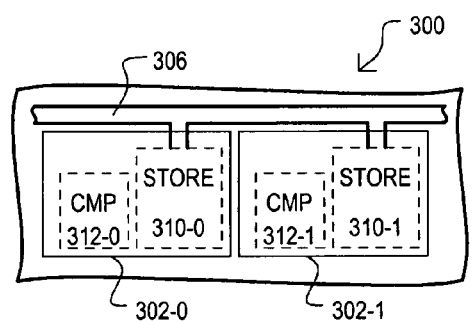
FIG. 3 is a block diagram of a CAM device according to yet another embodiment.

Referring now to FIG. 2, a CAM device according to an embodiment is shown in a top plan view, and designated by the general reference character 200. A CAM device 200 can include some of the same general sections as FIG. 1A, thus like sections are referred to by the same reference character but with the first digit being a "2" instead of a "1".

FIG. 2 differs from that of FIG. 1A, in that each CAM cell (202-0 and 202-1) is shown to include a store circuit (210-0 and 210-1) and a compare circuit (212-0 and 212-1). A store circuit (210-0 and 210-1) can store data values for use by a CAM cell in a compare operation. For example, a store circuit (210-0 and 210-1) can store data values for comparison with received compare data values. A compare circuit (212-0 and 212-1) can generate a compare result based on a stored data value and a received compare data value.

FIG. 2 shows an arrangement in which a signal line 206 can provide a common connection among compare circuits of CAM cells (202-0 and 202-1). In one very particular configuration, CAM cells (202-0 and 202-1) can be formed in a common row, and signal line 206 can be a match line connected to compare circuit connections of the CAM cells (202-0 and 202-1). That is, CAM device 200 can have a substrate match line.

In another very particular configuration, CAM cells (202-0 and 202-1) can be formed in a common column, and signal line 206 can be a compare data line that provides compare data to compare circuits (212-0 and 212-1). That is, CAM device 200 can have a substrate compare data line.

In still another particular configuration, CAM cells (202-0 and 202-1) can be formed in a common column within a CAM cell array, and signal line 206 can be a pseudo mask value line that provides a mask value to compare circuits (212-0 and 212-1). That is, CAM device 200 can have a substrate mask value line.

In this way, a signal line can provide a common connection to compare circuits of multiple CAM cells.

Referring now to FIG. 3, a CAM device according to another embodiment is shown in a top plan view, and designated by the general reference character 300. A CAM device 300 can include some of the same general sections as FIG. 2, thus like sections are referred to by the same reference character but with the first digit being a "3" instead of a "2".

FIG. 3 differs from that of FIG. 2 in that a signal line 306 can provide a common connection among store circuits (310-0 and 310-1) of CAM cells (302-0 and 302-1). In one very particular configuration, CAM cells (302-0 and 302-1) can be formed in a common column within a CAM cell array, and signal line 306 can be a bit line that provides read and/or write data paths to store circuits (310-0 and 310-1). That is, a CAM device can have a substrate bit line.

In this way, a signal line can provide a common connection to store circuits of multiple CAM cells.

Forming a common signal line in a substrate can enable one contiguous substrate region to form both a signal line, as well as transistor regions for CAM cells connected to the signal line. Examples of such an arrangement will now be described with reference to FIGS. 4A to 6B.

Referring now to FIGS. 4A to 4D, a CAM device according to another embodiment is shown in a top plan view, and designated by the general reference character 400. A CAM device 400 can include some of the same general sections as FIGS. 1A to 1C, thus like sections are referred to by the same reference character but with the first digit being a "4" instead of a "1".

Figure 4A:
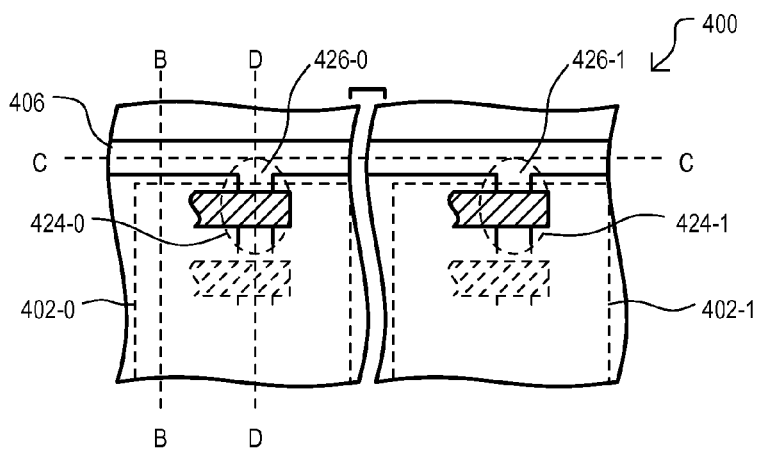
FIGS. 4A to 4E are various diagrams showing a CAM device having a substrate signal line that is contiguous with CAM cell transistors according to another embodiment.

FIG. 4A differs from FIG. 1A in that each CAM cell (402-0 and 402-1) is shown to include a cell transistor 424-0 to 424-1. Further, a signal line 406 and drain regions (426-0 and 426-1) of each cell transistor (424-0 to 424-1) can form a same contiguous doped portion of a substrate. Optionally, as shown by dashed lines, each CAM cell (402-0 and 402-1) can include one or more additional transistors having source-drain paths arranged in series with cell transistor (424-0 to 424-1).

Figure 4B:
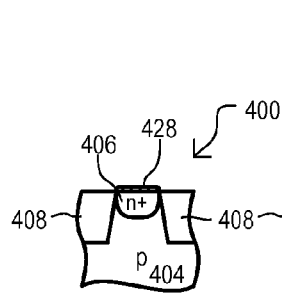
Figure 4C:
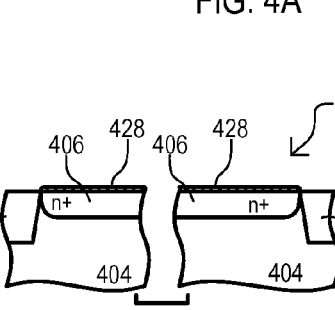

FIGS. 4B and 4C differ from FIGS. 1B and 1C in that a signal line 406 can be a highly doped n-type (i.e., n+) region, while a substrate 404 can be a more lightly doped p-type (p) region. A layer of silicide 428 can be formed on a surface of the n+ region of signal line 428.

Figure 4D:
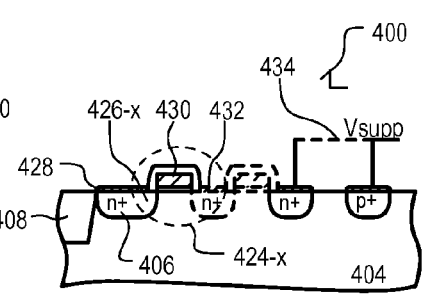

Referring now to FIG. 4D, CAM device 400 is shown in a side cross sectional view taken along line D-D of FIG. 4A. A cell transistor 424-x can be an n-channel insulated gate field effect transistor (IGFET) having a drain region 426-x (which can also serve as a portion of signal line 406), a control gate 430, and a source region 432. An optional additional transistor, having a series source-drain connection with cell transistor 424-x is shown by dashed lines. A source region 432 of cell transistor 424-x can be directly, or indirectly, connected to a power supply node 434, which in this particular example can be a low power supply voltage VSS, such as ground.

It is noted that in the arrangement of FIGS. 4B to 4D, while a p-type substrate 404 can be a "bulk" type substrate, in other embodiments, such a p-type substrate can be a p-well formed in a larger n-well (i.e., triple well process).

Figure 4E:
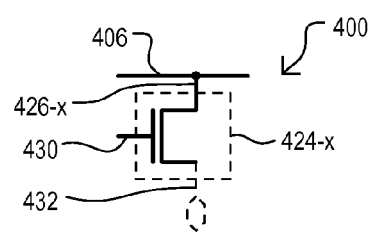

FIG. 4E shows a schematic diagram representation of the embodiment shown by FIGS. 4A to 4D. In one very particular arrangement, signal line 406 can be a match line, and cell transistor 424-x can be part of compare circuit within a CAM cell. In another particular arrangement, signal line 406 can be a bit line, and cell transistor 424-x can be an access transistor of a storage circuit within a CAM cell.

While FIGS. 4B to 4D have a shown an arrangement in which an n+ signal line 406 can be integrally formed with n+ drain regions of cell transistors within CAM cells, alternate embodiments can include reverse conductivity types. One such alternate arrangement is shown in FIGS. 5B to 5D.

Figure 5A:
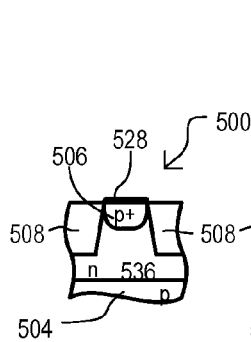
FIGS. 5A to 5D are various diagrams showing another example of a CAM device like that of FIG. 4A.
Figure 5B:
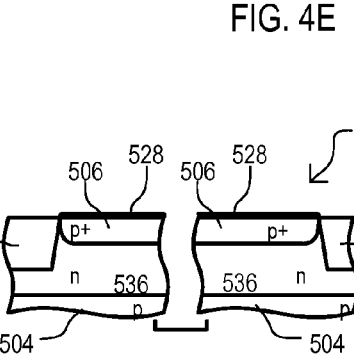
Figure 5C:
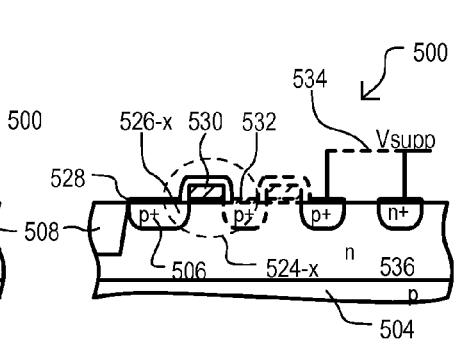

FIGS. 5A to 5C show the same general views and can include the similar structures as FIGS. 4B to 4D, and thus label like structures with the same reference character but with the first digit being a "5" instead of a "4".

FIGS. 5A to 5C can differ from that of FIGS. 4B to 4D, in that a signal line 506 can be a highly doped p-type (i.e., p+) region formed in a more lightly doped n-well 536. An n-well 536 can be formed in a p-type substrate 504.

Figure 5D:
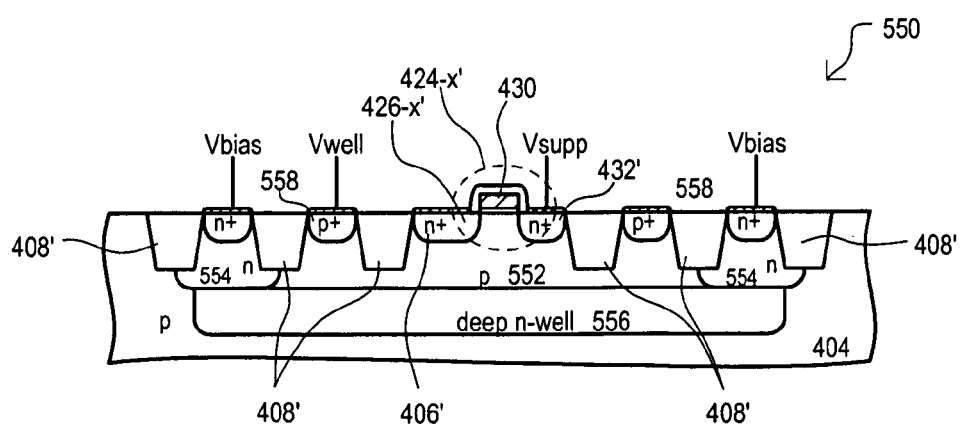

Referring now to FIG. 5D, a CAM device according to another embodiment is shown in a side cross sectional view, and designated by the general reference character 500. FIG. 5D shows an arrangement like that of FIG. 4D, including a substrate 404, a signal line 406' with silicide 428, and isolation structures 408'. Further, a cell transistor 424-x' can be formed in the substrate, and include a drain region 426-x', control gate 430', and source region 432'.

The arrangement of FIG. 5D can differ from that of FIG. 4D in that signal line 406' and cell transistor 424-x' can be formed in a p-well 552 that can be surrounded by n-type doped regions. In particular, p-well 552 can be surrounded in the lateral direction (horizontally in FIG. 5D) by n-wells 554, and vertically by a deep n-well 556. In such an arrangement, the n-type area (554/556) can be separately biased with a voltage Vbias. Such an arrangement can help electrically isolate operations of cell transistor 424-x' from other devices in an integrated circuit.

While p-well 552 can be biased with a well potential Vwell by one or more discrete well connections, optionally, a well 552 can include a surrounding p+"guard ring" structure 558 that follows the periphery of p-well 552. Such an arrangement can provide additional isolation with regard to device switching.

In this way, a CAM device can include a doped contiguous substrate region that forms drain regions for transistors within different CAM cells, as well as a signal line connecting such drains to one another.

While the above described signal lines can serve as various structures in a CAM device (e.g., bit line, compare data line, global mask line), such structures may be particularly advantageous when utilized as match lines in a CAM device array. Various examples of match line embodiments will now be described.

Referring now to FIGS. 6A and 6B, a CAM device having a substrate match line is shown in a series of views, and designated by the general reference character 600. A CAM device 600 can include many of the same general sections as that of FIGS. 4D and 4E, thus like sections are referred to by the same reference character but with the first digit being a "6" instead of a "4".

FIGS. 6A and 6B show a CAM device 600 having a match line 606 formed in a substrate that can be commonly connected to multiple CAM cells. Such CAM cells can include a compare "stack" formed by one or more transistors having source-drain paths connected between match line 606 and a reference node. Further, at least some of the compare transistors can have gates connected to latch type storage elements.

FIG. 6A shows a side cross sectional view including a match line 606, a compare section 638, and a storage section 640. It is understood that a match line 606 can be an elongated structure, as described in the above embodiments, and thus extends into the page in the view of FIG. 6A. Further, such a match line 606 can be commonly connected to multiple other compare sections (not shown). In addition, the storage section 640 of FIG. 6A shows but one half of a static random access memory (SRAM) type storage element.

FIG. 6B is a schematic diagram showing the arrangement like that of FIG. 6A. FIG. 6B shows the additional two transistors that can form an SRAM storage element.

Figure 26A:
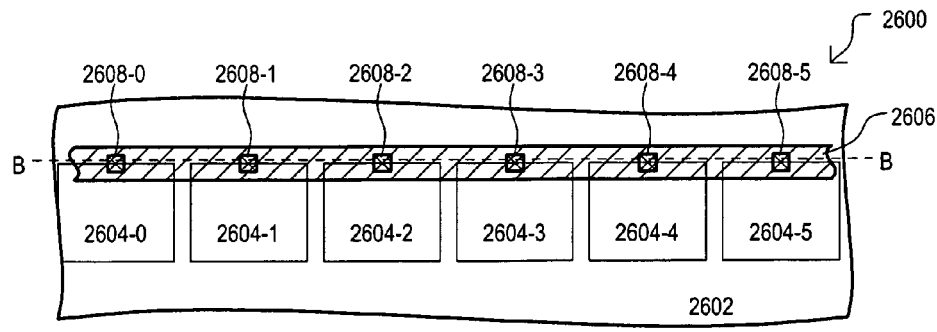
FIGS. 26A and 26B show a conventional match line arrangement for a CAM device.
Figure 26B:
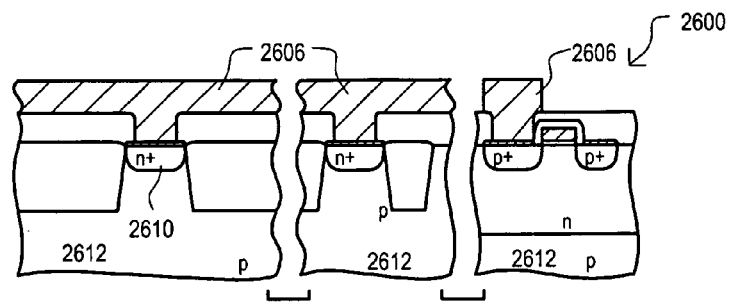

Because a match line 606 is formed in a substrate, unlike a conventional approach like that of FIGS. 26A and 26B, a first layer of metallization can be used for purposes other than forming match lines. That is, forming match lines in a substrate can free a layer of metallization. In the particular arrangement of FIGS. 6A and 6B, such a first metallization layer 642 can be utilized to interconnect circuit components (i.e., as a "local interconnect"). More particularly, first metallization layer can provide at least part of the conductive path that provides a compare data value from storage section 640 to compare section 638.

While the embodiment of FIGS. 6A and 6B shows a CAM cell arrangement that includes an SRAM type storage element, alternate embodiments can include other types of storage elements. One of the many possible alternate arrangements in shown in FIGS. 7A and 7B.

FIGS. 7A and 7B show the same views and general sections as FIGS. 6A and 6B, thus like sections are referred to by the same reference character but with the first digit being a "7" instead of a "6".

FIGS. 7A and 7B can differ form that FIGS. 6A and 6B in that a storage element can be a dynamic RAM (DRAM) type element. Thus, a storage section 740 can include a storage capacitor C1 and access transistor N1. As in the case of FIGS. 6A and 6B, formation of a match line 706 within a substrate can advantageously free up a layer of interconnect (or enable a CAM device to be fabricated with fewer layers).

FIG. 8 is a table comparing layer usage between a conventional case like that of FIGS. 26A and 26B ("CONV"), that that illustrated by the embodiments of FIGS. 6A to 7B ("EMB"). Of course, other embodiments can use layers for different purposes, but share the feature of additional interconnect resources over the described conventional approach.

In this way, forming match lines in a substrate can free up all or a portion of an overlying conductive layer, as compared to conventional approaches utilizing a conductive layer for match lines.

Referring now to FIG. 9, a CAM device, like that shown in FIGS. 6A to 7B is shown in a diagram that illustrates capacitive effects on a match line. FIG. 9 shows a CAM device 900 that includes a match line 902 formed in a substrate. This is in contrast to the conventional arrangement of FIG. 27, where a match line is formed by patterning a first metallization layer.

Figure 27:
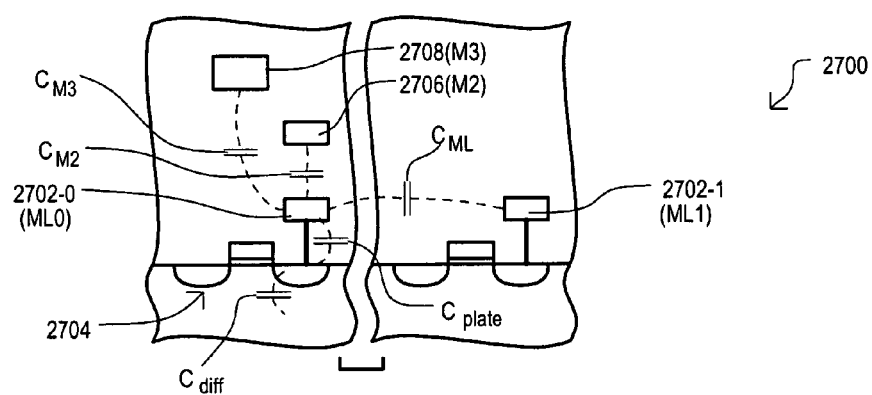
FIG. 27 is a diagram showing a capacitance that can be presented by a match line like that shown in FIGS. 26A and 26B.

As in the case of FIG. 27, the structure of CAM device 900 can result in various components contributing the effective capacitance of a match line 902. FIG. 9 shows such components as $C_{diff}$, $C_{MS}$, $C_{M2}$, $C_{M3}$.

Capacitance $C_{diff}$ can be a diffusion capacitance formed at the p-n junction created by the match line 902 formed within an oppositely doped substrate. Advantageously, such a junction capacitance can fall as the junction reverse bias of the junction increases. Thus, when a match line 902 is placed into a precharged state prior to a compare operation, it can present a lower capacitance $C_{diff}$ than when in the discharged state. Unlike the conventional case of FIG. 27, match line 902 has no plate component $C_{plate}$.

Referring still to FIG. 9, capacitances $C_{M1}$, $C_{M2}$, $C_{M3}$ can be capacitances due to coupling between match line 902 and overlying metallization layers. However, the values of such capacitances can fall off in proportion to the square of the distance. As a result, for the substrate match line case of FIG. 9, such coupling capacitances can be relatively small, as compared to metal layer to metal layer coupling shown in FIG. 27, where match line 2702-0 can be in closer proximity to overlying metallization lines 2706 and 2708.

In this way, forming a match line in a substrate can result in a match line having lower capacitance than a match line formed with a metallization layer. As noted above, reductions in match line capacitance can translate directly into power consumption savings. Still further, while a substrate match line may have a higher component resistance than a metallization line, the lower capacitance of a substrate match line may compensate for any increased resistance to provide fast switching speeds.

Referring now to FIGS. 10A to 10D, various examples of possible CAM cell circuits that can be formed with substrate match lines are shown in series of schematic diagrams, and designated by the general reference characters 1000-A to 1000-D. Each CAM cell (1000-A to 1000-D) can include a match line 1006-A to 1006-D, a compare section 1038-A to 1038-D, and a store section 1040-A to 1040-D. Each match line 1006-A to 1006-D can be formed in a substrate as described by various embodiments herein.

Each compare section (1038-A to 1038-D) can generate a match result according to a comparison between data values provided by the corresponding store section (1038-A to 1038-D) and a received compare data value CD/BCD. More particularly, if a stored data value matches a compare data value (CD/BCD) (or is masked to such a match state), each compare section (1038-A to 1038-D) can maintain a high impedance path between its corresponding match line 1006-A to 1006-D and a reference node 1044-A to 1044-D. If a stored data value does not match a compare data value (CD/BCD) (and is not masked to match state), each compare section (1038-A to 1038-D) can provide a charge transfer path between its corresponding match line 1006-A to 1006-D and reference node 1044-A to 1044-D.

It is noted that compare section 1038-A of FIG. 10A includes precharge transistors controlled by precharge signals. Such transistors can be enabled prior to a compare operations to ensure that gates of transistors N10 and N10' are not left at an undetermined potential prior to or during a compare operation.

Still further, while the embodiments of FIGS. 10B to 10D show n-channel transistors arranged in a particular order, alternate embodiments can have a different ordering of such transistors. For example, in the embodiment of FIG. 10B, while n-channel transistors receiving signals CD and BCD are arranged closer to match line 1006-B than transistors connected to storage section 1040-B, the order of such transistors can be switched.

Of course, FIGS. 10A to 10D are but a few examples of possible CAM cells.

In this way, a substrate match line can be utilized with various types of CAM cells.

Utilizing a substrate line as a common, non-power supply connection among multiple CAM cells may result in some device configurations being susceptible to latch-up. In particular, driving a substrate line can result in substrate currents that can turn on parasitic transistors resulting in latch-up. The present invention can include embodiments having advantageous placement of power supply connections (taps) that can help reduce susceptibility to latch-up. Examples of such embodiments are shown in FIGS. 11 to 14.

Referring now to FIG. 11, a CAM device according to another embodiment is shown in a top plan view, and designated by the general reference character 1100. A CAM device 1100 includes a first match line 1106-0 connected to multiple CAM memory cells formed in a first memory cell region 1146-0, as well as a second match line 1106-1 connected to multiple CAM memory cells formed in a second memory cell region 1146-1. First and second match lines (1106-0 and 1106-1) can be formed in a substrate 1104, and separated from one another by an isolation structure 1108.

A CAM device 1100 can also include a set of taps associated with each memory cell region (1146-0 and 1146-1) that can help maintain substrate regions at a relatively constant potential while match lines within such substrate regions are driven to varying potentials. Accordingly, a set of taps can be formed at one or more edges of a memory cell region. For example, a set of taps can be formed on at an edge of first memory cell region opposite to the corresponding match line. In the very particular example of FIG. 11, a first set of taps 1148-0 is not only formed at an edge of a first memory cell region 1146-0 opposite to first match line 1106-0, but is formed to essentially surround a first memory cell region 1146-0 on all sides except that next to first match line 1106. A second set of taps 1148-1 can surround second memory cell region 1146-1 in the same general fashion.

In this way, a CAM device can include CAM cell areas having a substrate match line on one side, and sets of taps on an opposing side, or on all other sides in a surrounding fashion.

Referring now to FIG. 12A, a more detailed example of substrate tapping is shown for a CAM device in a top plan view. FIG. 12A shows some of the same general structures as FIG. 11, thus like structure are referred to by the same reference character but with the first digit being a "12" instead of a "11". FIG. 12A shows how a set of taps 1248-0 and 1248-1 can include multiple contacts (one contact shown as 1250) to a substrate.

Referring now to FIG. 12B, an example of a CAM device like that of FIG. 12A is shown in a side cross sectional view taken along line B-B of FIG. 12A. The CAM device 1200' of FIG. 12B shows an arrangement in which match lines (1206-0 and 1206-1) can be formed in a p-type substrate 1204. Thus, tap regions (1248-0 and 1248-1) can include highly doped p-type (p+) regions within substrate 1204 that are connected to a low power supply voltage VSS. A low power supply voltage VSS can be ground, as but one example. In alternate embodiments a low power supply voltage can be a negative "back-bias" voltage.

Referring to FIG. 13, another example of a CAM device like that of FIG. 12A is shown in a side cross sectional view taken along line B-B of FIG. 12A. The CAM device 1300 of FIG. 13 shows the same general arrangement as FIG. 12B, thus like structure are referred to by the same reference character but with the first two digits being "13" instead of "12".

FIG. 13 differs from FIG. 12B in that match lines (1306-0 and 1306-1) can be p-type regions in an n-type well 1336. Thus, tap regions (1348-0 and 1348-1) can include highly doped n-type (n+) regions within well 1336 that are connected to a high power supply voltage VDD.

While embodiments shown above have illustrated substrate lines (e.g., match or bit lines) contiguous with drains of CAM cell transistors, in other arrangements a match line may be of an opposite conductivity type to drains of corresponding CAM cell transistors. In such a case, a substrate line will not be contiguous with the drains of CAM cell transistors. Examples of such an arrangement are shown in FIGS. 14A to 15.

FIG. 14A shows a top plan view of a CAM device designated by the general reference character 1400. FIG. 14A includes some of the same general structures as FIG. 4A, thus like structures are referred to by the same reference character but with the first digits being "14" and not "4".

FIG. 14A can differ from that of FIG. 4A in that a signal line 1406 can be of opposite conductivity type to that of cell transistor drain regions 1426-0 and 1426-1. As a result, a CAM cell 1400 can include interconnect structures 1450-0 and 1450-1 that provide a current path between match line 1406 can drain regions 1426-0 and 1426-1, respectively. Interconnect structures (1450-0 and 1450-1) can be formed from a conductive layer formed over a substrate 1404. As but one of the many possible examples, interconnect structures (1450-0 and 1450-1) can be formed by a local interconnect layer.

Referring now to FIG. 14B, an example of a CAM device like that of FIG. 14A is shown in a side cross sectional view taken along line B-B of FIG. 14A. The CAM device 1400' of FIG. 14B shows an arrangement in which a match line 1406 can be a p+ region formed in an n-well 1436, while a cell transistors 1424-x can be an n-channel transistor.

FIG. 15 shows the same general arrangement as FIG. 14B, but with opposite conductivity types. Thus, a match line 1506 can be an n+ region formed in a p-type substrate 1504, while cell transistor 1524-x can be p-channel transistor.

Some of the above embodiments have described a CAM device having match lines formed in a substrate. However, it is understood that such a match line need not be entirely formed in a substrate. Alternate embodiments can include match lines formed both above and within a substrate. One such example is shown in FIG. 16.

Referring now to FIG. 16, a CAM device according to another embodiment is shown in a side cross sectional view, and designated by the general reference character 1600. A CAM device 1600 can include a substrate match line portion 1606', a surface match line portion 1652, and a connector structure 1654. A substrate match lien portion 1606' can include a match line formed in a substrate 1604 according to the various embodiments described herein. While substrate match line portion 1606' is shown as an n+ region, alternate arrangements could include p+ regions formed in an n-type area. It is understood that substrate match line portion 1606' can be connected to multiple CAM cells of logical group (e.g., a row).

A surface match line portion 1652 can be formed over and in contact with a substrate 1604. As but one example, a surface match line portion 1652 can be created by etching contacts and patterning a first metallization layer of a CAM device. Preferably, surface match line portion 1652 can be connected to multiple CAM cells of the same logical group as substrate match line portion 1606'.

A connector structure 1654 can directly or indirectly connect substrate match line portion 1606' to surface match line portion 1652. A connector structure 1654 can provide a direct connection (i.e., uninterrupted conductive path) between portions 1606' and 1652 or a buffered connection. Alternatively, a connector structure 1654 can be a circuit that can control the operation of one portion (1606' or 1652) according to the match result of the other portion (1652 or 1606'). Even more particularly, if one portion indicates a miss, a precharge operation for the other portion can be prevented, and if the one portion indicates a hit, the precharge operation of the other portion can be allowed. As but another example, a connector structure 1654 can logically combine results from the two portions (1606' or 1652) (e.g., OR, NOR, AND, NAND, XOR or XNOR the two results).

In this way, a CAM device can include match lines, or match line portions that are formed both in a substrate and over a substrate.

As noted above, while embodiments of the present invention can include CAM device having match lines formed in a substrate, alternate embodiments can include a CAM device having bit lines formed in a substrate. Examples of such an arrangement will now be described with reference to FIGS. 17A and 17B.

Figure 17A:
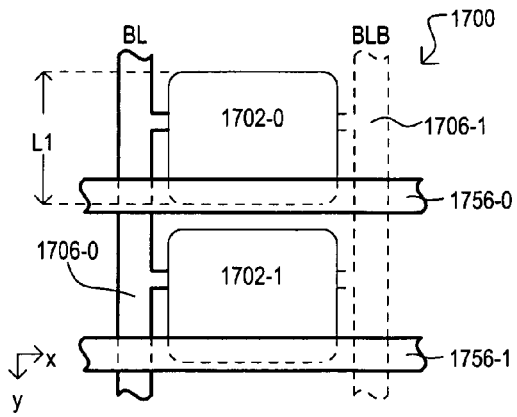
FIGS. 17A and 17B are two views showing a CAM device with substrate bit line according to an embodiment.

Referring now to FIG. 17A, a CAM device is shown in a top plan view and designated by the general reference character 1700. A CAM device 1700 can include some of the same general sections as FIGS. 1A to 1C, thus like sections are referred to by the same reference character but with the first digits being "17" and not a "1".

FIG. 17A differs from that of FIG. 1A in that a signal line 1706-0 formed in a substrate is specifically shown to be a bit line. A bit line 1706-0 can serve as data path to and/or from CAM cells 1702-0 and 1702-1. More particularly, a bit line 1706-0 can provide or read or write path for a data value that is compared against an applied compare data value. In addition or alternatively, such a data value can be mask value for controlling a match result of a CAM cell. CAM cells (1702-0 and 1702-1) are preferably CAM cells of a same column in a CAM cell array.

Referring still to FIG. 17A, CAM cells (1702-0 and 1702-1) can each occupy an area of a substrate, shown a series of rectangular areas arranged in the y-direction (though variations in shape of area occupied can occur depending upon CAM cell type). An area occupied by a CAM cell (1702-0 to 1702-3) can have a length in the y-direction. For example, FIG. 17A shows such a length of CAM cell 1702-0 by the reference character "L1".

In the particular case of FIG. 17A, a CAM cell device 1700 can include complementary substrate bit lines 1706-0 and 1706-1. In such an arrangement, during a write operation, complementary data values can be driven on such a bit line pair (1706-0 and 1706-1), and in a read operation a differential voltage can be generated between such a bit line pair (1706-0 and 1706-1).

FIG. 17A also shows match lines 1756-0 and 1756-1. Such match lines (1756-0 and 1756-1) can interconnect compare circuits of CAM cells in a direction opposite to that of CAM cells (1702-0 and 1702-1) (e.g., a row direction). In one particular arrangement, match lines (1756-0 and 1756-1) can include a metallization layer formed over a substrate (and hence over bit lines 1706-0 and 1706-1).

Figure 17B:
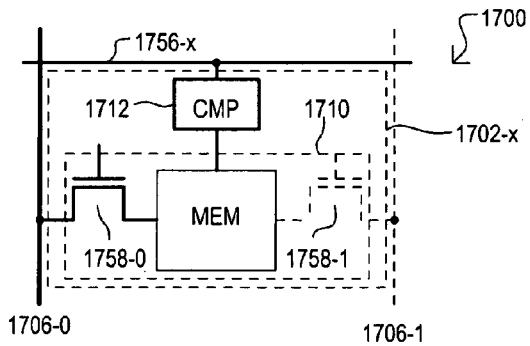

FIG. 17B is a schematic diagram showing one possible arrangement for the CAM device shown in FIG. 17A. FIG. 17B shows a CAM cell 1702-x connected to substrate bit line

1706-0 (and optionally complementary substrate bit line 1706-1) and match line 1756-x. CAM cell 1702 can include a store section 1710 and compare section 1712. In the very particular example of FIG. 17B, a substrate bit line (1706-0 or 1706-1) can be connected to pass devices (1758-0 or 1758-1) within a store section 1710. It is noted that while FIG. 17B shows pass devices (1758-0 or 1758-1) as n-channel transistors, alternate embodiments could include other pass devices including but not limited p-channel transistors, or complementary metal-oxide-semiconductor (CMOS) type passgate structures.

In this way a CAM device can include bit lines formed by uninterrupted portions of a substrate.

As also noted above, embodiments of the present invention can further include a CAM device having compare data lines formed in a substrate. Examples of such an arrangement will now be described with reference to FIGS. 18A to 18F.

Figure 18A:
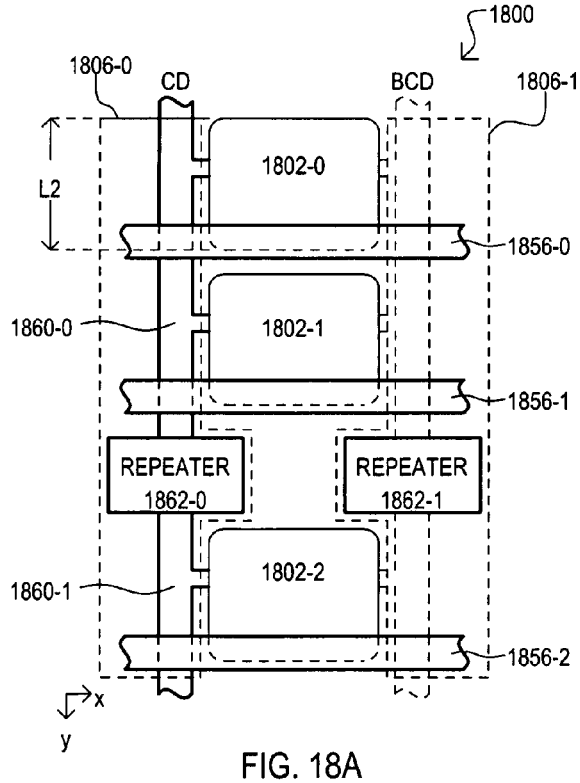
FIGS. 18A to 18E are various views showing examples of CAM devices having substrate compare data lines according to various embodiments.

Referring now to FIG. 18A, a CAM device is shown in a top plan view and designated by the general reference character 1800. A CAM device 1800 can include some of the same general sections as FIGS. 1A to 1C, thus like sections are referred to by the same reference character but with the first digits being "18" and not a "1".

FIG. 18A differs from that of FIG. 1A in that a signal line 1806-0 formed in a substrate is specifically shown to be a compare data line. A compare data line 1806-0 can provide a compare data to compare circuits within CAM cells 1802-0 to 1802-2. In the very particular example of FIG. 18A, a compare data line 1806-0 can include multiple sections 1860-0 and 1860-1 that are connected one another by a repeater circuit 1862-0. CAM cells (1802-0 to 1802-2) are preferably CAM cells of a same column in a CAM cell array.

As in the case of FIG. 17A, in FIG. 18A, CAM cells (1802-0 to 1802-2) can each occupy an area of a substrate, shown a series of rectangular areas arranged in the y-direction (though variations in shape of area occupied can occur depending upon CAM cell type). Such an area occupied by a CAM cell (1802-0 to 1802-3) can have a length in the y-direction. For example, FIG. 17A shows such a length of CAM cell 1802-0 by the reference character "L2".

In the example of FIG. 18A, a CAM cell device 1800 can include complementary substrate compare data lines 1806-0 and 1806-1. In a compare operation, complementary data values can be driven on such compare data line pair (1806-0 and 1806-1). In particular arrangements, in a non-compare operation, such as a precharge operation, a compare data line pair (1806-0 and 1806-1) can be driven to a same potential.

FIG. 18A also shows match lines 1856-0 to 1856-2. Match lines (1856-0 to 1856-2) can interconnect compare circuits of CAM cells in a direction opposite to that of CAM cells (1802-0 to 1802-2) (e.g., a row direction). Like FIG. 17A, in one particular arrangement, match lines (1856-0 to 1856-2) can include a metallization layer formed over a substrate.

Figure 18B:
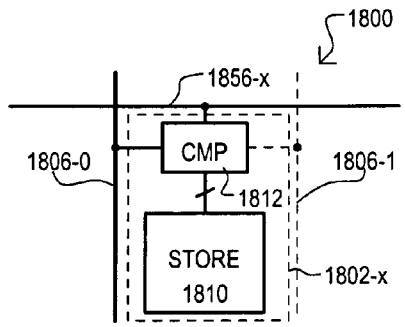

FIG. 18B is a schematic diagram showing one possible arrangement for the CAM device shown in FIG. 18A. FIG. 18B shows a CAM cell 1802-x connected to substrate compare line 1806-0 (and optionally complementary compare data line 1806-1) and match line 1856-x. CAM cell 1802 can include a store section 1810 and compare section 1812. A substrate compare data line (1806-0 and/or 1806-1) can connect to a compare section 1812 in various ways depending upon the configuration of the compare section 1812. Two of the many possible examples of compare data line connections are shown in schematic diagram form, in FIGS. 18C and 18D.

Figure 18C:
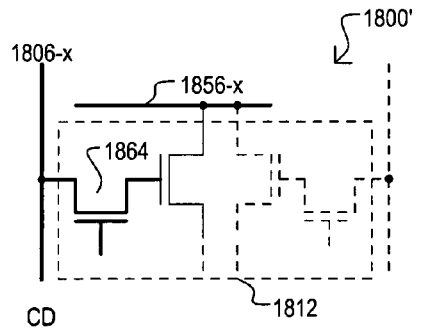

Referring to FIG. 18C, a CAM device 1800' is shown in which a substrate compare data line 1806-x is connected to a drain of a compare transistor 1864. If compare data line 1806-x and a drain of transistor 1864 are the same conductivity type, a compare data line 1806-x (or section thereof) and drains of multiple compare transistors can be formed from one uninterrupted portion of the substrate, like that arrangement shown in FIGS. 4A to 4D. If a compare data line 1806-x and a drain of transistor 1864 are of different conductivity types, a compare data line 1806-x (or section thereof) can be connected to drains of multiple compare transistors in a fashion like that shown in FIGS. 14A and 14B, as but one example.

Figure 18E:
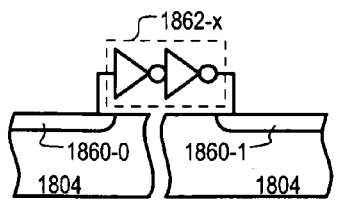
Figure 18D:
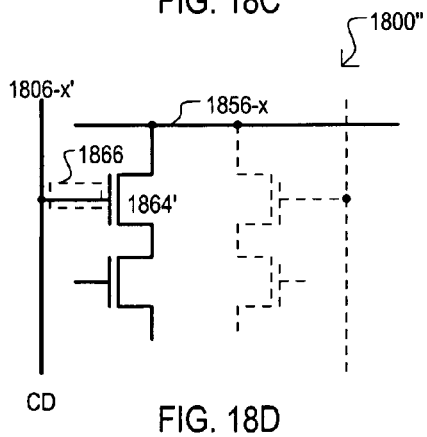

Referring to FIG. 18D, a CAM device 1800" is shown in which a substrate compare data line 1806-x is connected to a gate of a compare transistor 1864' by a cell connection structure 1866. While such a cell connection structure can be formed by a local interconnect layer composes of a first metallization layer, alternatively, such a connection can include a "buried contact" arrangement, in which a patterned gate layer structure can form a control gate of compare transistor 1864 and also makes direct contact with substrate compare data line 1806-x.

Referring now to FIG. 18E, a repeater circuit arrangement, like that shown as 1862-0 and 1862-1 in FIG. 18A is shown in diagrammatic form. FIG. 18E shows a repeater structure 1862-0 that can be a noninverting buffer circuit having an input connected to one compare data line section (e.g., 1860-0) and an output connected to another compare data line section (e.g., 1860-1). Such an arrangement can be repeated in a columnwise direction to achieve a desired compare data propagation speed through a CAM cell array, or portion thereof.

In this way, a CAM device can include compare data lines formed by uninterrupted portions of a substrate.

Figure 19:
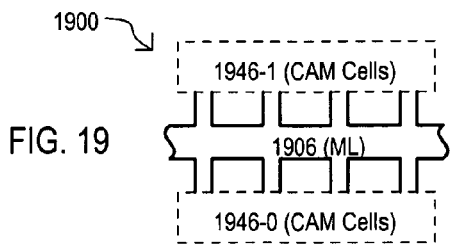
FIGS. 19 and 20 are to plan views showing variations in a CAM device according to embodiments.
Figure 20:
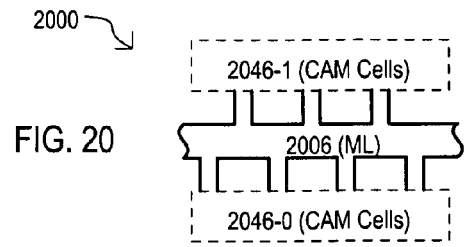

Various embodiments disclosed above have shown arrangements in which a signal line formed in a substrate can be connected to CAM cells on one side of such a line. Such an arrangement should not be construed as limiting to the invention. FIGS. 19 and 20 show alternate arrangements.

Referring now to FIG. 19, a CAM device 1900 is shown in a top plan view. A CAM device 1900 can include a signal line 1906 formed in a substrate that is connected to one CAM cell region 1946-0 on one side, and to another CAM cell region 1946-1 on an opposing side.

FIG. 20 shows an arrangement like that of FIG. 19 except that connections between CAM cell regions (2046-0 and 2046-1) are not aligned with one another in a direction perpendicular to the elongated direction of signal line 2006 (vertical in FIG. 20).

In this way, a CAM device substrate signal line can be connected to CAM cell regions on opposing sides.

While the present invention can include device structures formed in a CAM device, such as integrated circuit structures, the present invention can also include methods for forming such structures and/or pattern creation devices (or data structures) utilized by integrated circuit manufacturing devices. Examples of such embodiments will now be described with reference to FIGS. 21 to 25.

Figure 21:
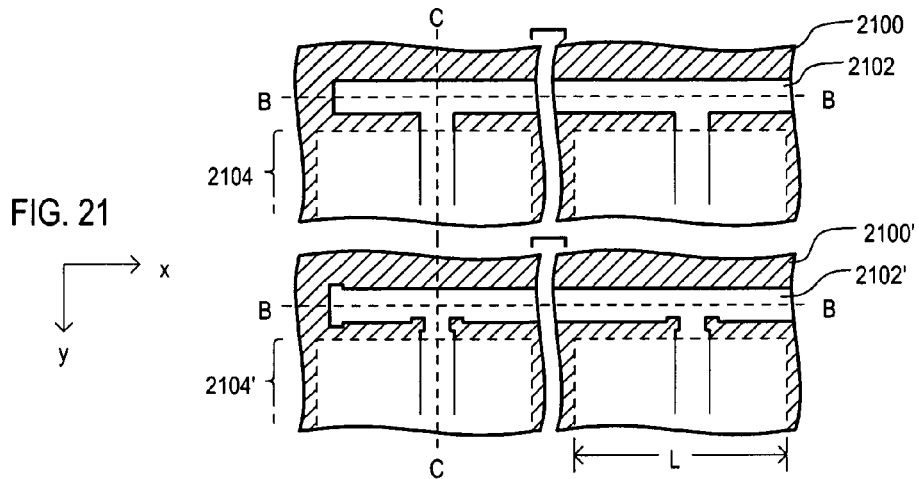
FIG. 21 shows examples of CAM device structures, according to embodiments, that can be used to fabricate a CAM integrated circuit device.

Referring to FIG. 21, examples of semiconductor manufacturing patterns that can be utilized in an integrated circuit manufacturing device are shown and designated by the general reference characters 2100 and 2100'. A manufacturing pattern 2100 can be utilized in an integrated circuit layout step, or simulation step, or fabrication step. A manufacturing pattern 2100 can have the same general shape as desired integrated circuit device structure. As but one example, manufacturing pattern 2100 can be understood to have the same shape as signal line 106 and connections to CAM cells as shown in FIG. 1A.

Referring still to FIG. 21, a manufacturing pattern 2100 can have one continuous shape that includes an elongated section 2102 arranged in one direction (x-direction in the figure) as well as CAM cell regions 2104 that extend from the elongated section 2102. CAM cell regions 2104 are only partially shown as a particular CAM cell pattern can vary according to CAM cell type.

In one particular example, a manufacturing pattern 2100 can define an "active" area for a semiconductor device. An active area can define those regions in which transistors can be formed, and according to the embodiments of the invention, can further define regions where CAM cell substrate lines are formed.

It is noted that in some forms, a manufacturing pattern can vary from a desired device pattern. For example, a starting pattern (like 2100) could be modified to include correction features to compensate for errors that can be introduced by a manufacturing step. As but one particular example, FIG. 21 shows alternate pattern 2100' which includes "serifs" for optical proximity correction of pattern errors that can result in pattern transfer process. Thus it is understood that while a manufacturing pattern may be essentially the same as a resulting device pattern, such a pattern may also be different form the resulting device pattern.

It is understood that manufacturing patterns (e.g., 2100 and/or 2100') according to embodiments of the invention can take various forms, including but not limited to a photomask (e.g., "reticle") utilized in a pattern generating device, or a data file that can define image regions. A data file can be read by an application program executed on a computer or by another manufacturing device (e.g., photomask fabricator, or a stepper that accepts electronic photomask data). As but one very particular example, such a data can define a manufacturing pattern as a series of pixels in either raw form, or a data compacted form.

Having described a manufacturing pattern for use in an integrated circuit manufacturing process, a method of making an integrated circuit device according to an embodiment will now be described with reference to FIGS. 22A to 22D. Each of FIGS. 22A to 22D shows two different views of a structure that can be manufactured according to either pattern (2100 or 2100') shown in FIG. 21. Left portions of 22A to 22D show views corresponding to line B-B of FIG. 21, and right portions show views corresponding to line C-C of FIG. 21.

Figure 22A:
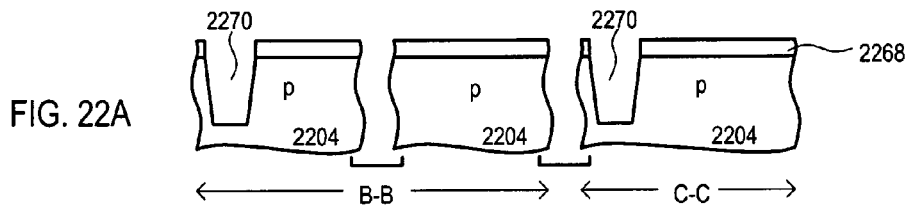
FIGS. 22A to 22D are a series of side cross sectional views showing a method of fabricating a CAM integrated circuit device with a structure like that of FIG. 21.

Referring now to FIG. 22A, an etch pattern can be formed on a semiconductor substrate 2204. In one arrangement, a manufacturing pattern 2100 can be transferred onto an isolation mask layer to create an isolation mask 2268 on a substrate 2204. Even more particularly, an isolation mask layer can be formed on a substrate 2204, and a layer of photoresist (not shown) can be formed on the isolation mask. A manufacturing pattern 2100 can then be developed in a photoresist layer utilizing photolithographic techniques. The patterned photoresist can then be used as an etch mask to pattern isolation mask layer and thereby form isolation mask 2268. It is noted that alternate embodiments can include other pattern transfer techniques depending upon the manufacturing process utilized.

Referring still to FIG. 22A, isolation mask 2268 can be used to define "active" areas in substrate 2204, including a contiguous region for a substrate signal line. In particular, an isolation mask 2268 can define isolation structures that represent the extents of an active area. In the very particular example of FIG. 22A, isolation structures can be shallow trench isolation (STI) structures. Thus, an isolation mask 2268 defines where isolation trenches 2270 can be formed. An isolation mask 2268 can be formed by a layer of silicon nitride. In other embodiments, different isolation techniques can be used, such as the local oxidation of silicon (LOCOS), as but one example.

Figure 22B:
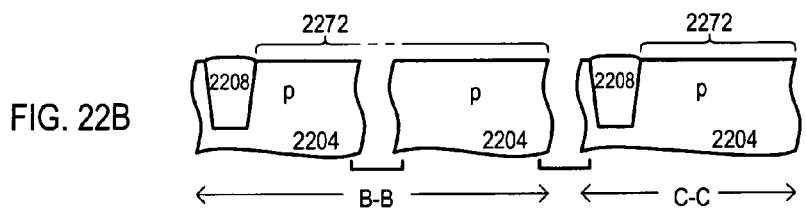

Referring to FIG. 22B, a method can continue by completing the formation of isolation structures 2208 within trenches. In one very particular arrangement, trenches 2270 can be filled with an insulating material, and planarized. Such a step can thus define active area 2272. An active area 2272 can be subject to other manufacturing steps, such as a transistor threshold ion implantation step, as but one example.

In this way, a manufacturing pattern can define an active area that defines an area for a substrate signal line, as well as locations for CAM cells transistors connected to such a substrate signal line.

Figure 22C:
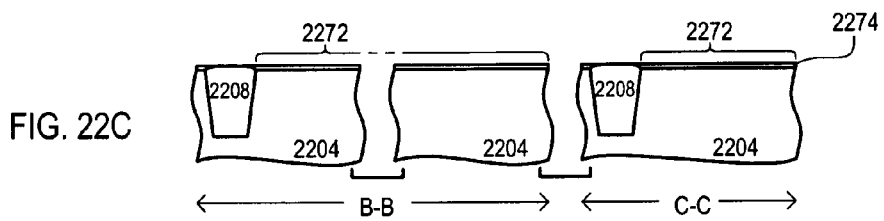

Referring to FIG. 22C, a method can continue by forming a gate insulating layer 2274 on active area 2272. Such a step can include cleaning and oxidizing a substrate surface, or depositing a layer on a substrate, or some combination thereof.

Figure 22D:
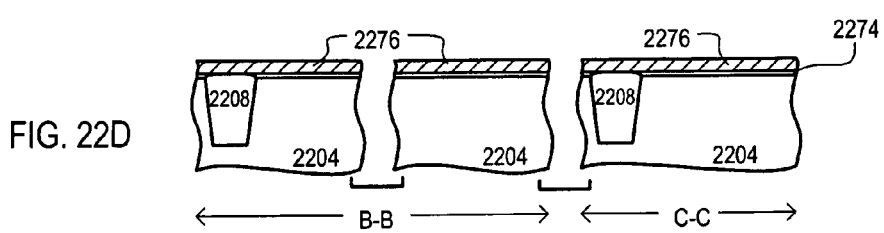

Referring to FIG. 22D, once a gate insulating layer 2274 is formed, a method can form a gate electrode layer 2276 on the gate insulating layer 2274. In one particular arrangement, such a step can include depositing a layer of polycrystalline silicon or amorphous silicon. Such layer can be doped in situ, or doped via ion implantation, as but two examples.

Figure 23:
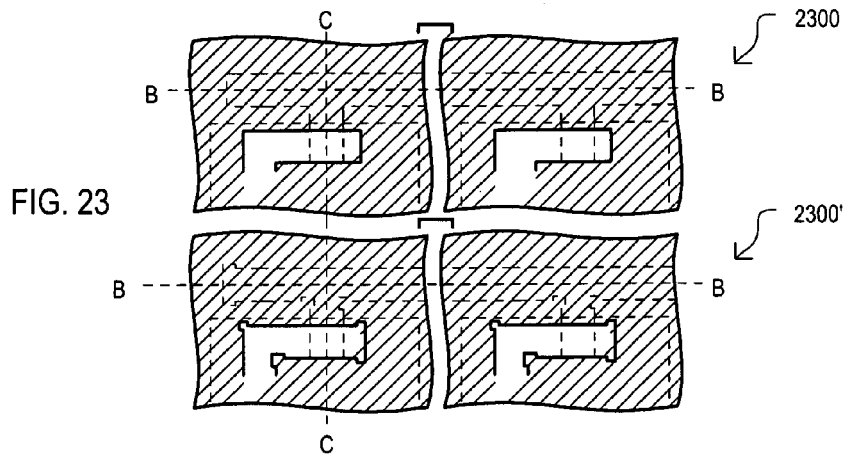
FIG. 23 shows examples of a CAM device structures according to an embodiment that can be used in conjunction with that of FIG. 21 to fabricate a CAM integrated circuit device.

Referring now to FIG. 23, another semiconductor manufacturing pattern for use in an integrated circuit manufacturing device is shown and designated by the general reference characters 2300 and 2300'. Like manufacturing patterns 2100 and 2100', manufacturing patterns 2300 (and 2300') can be utilized in integrated circuit layout, simulation, or fabrication step. Such patterns (2300 or 2300') can also take the various forms noted for patterns 2100 and 2100', above.

Referring still to FIG. 23, manufacturing patterns 2300 (or 2300') can define locations of one or more gate structures formed in an active area previously defined by pattern 2100 (or 2100'). FIG. 23 shows patterns 2100 and 2100' superimposed onto patterns 2300 and 2300', respectively.

Figure 24A:
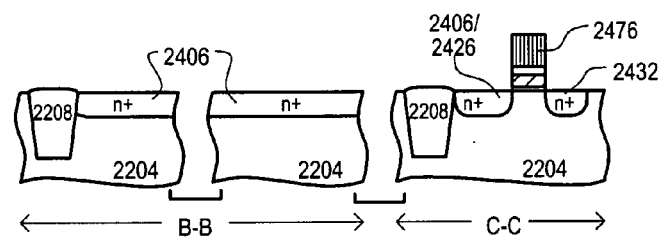
FIGS. 24A and 24B are a series of side cross sectional views showing a method of fabricating a CAM integrated circuit device with a structure like that of FIG. 23.

Referring now to FIG. 24A, following a step like that shown in FIG. 22D, a gate etch mask 2476 can be formed on a gate electrode layer. In one arrangement, a top insulating layer can be formed on a gate electrode layer. A layer of photoresist can then be formed on such a top insulating layer. A manufacturing pattern 2300 can then be developed in a photoresist layer utilizing photolithographic techniques to form a gate etch mask 2476. As the case of FIG. 22A, alternate embodiments can include other pattern transfer techniques depending upon the manufacturing process utilized.

Referring still to FIG. 24A, a gate etch mask 2476 can then be used to form gate structures for transistors, including cell transistors within each CAM cell region.

Referring yet again to FIG. 24A, following the formation of transistor gate structures, an impurity introducing step can be then be used to simultaneously create a signal line 2406, as well as source regions (e.g., 2432) and drain regions (e.g., 2426) of transistors having the same conductivity type as the signal line 2406. An impurity introducing step can include one or more ion implantation steps, as but one example.

In this way, a single impurity introducing step can form all or part of both a substrate signal line and CAM cell transistor drains integrally formed with such a substrate signal line.

Figure 24B:
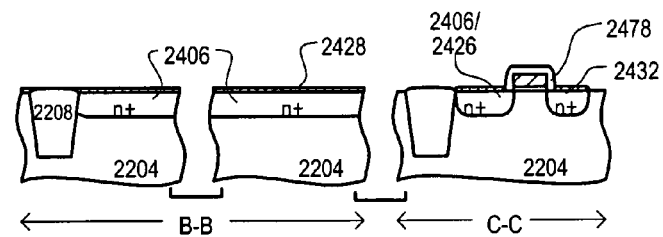

Referring to FIG. 24B, a method can continue by forming insulating sidewalls 2478 on transistor gates. Optionally, another impurity introducing step can be executed to further define signal line 2406, source regions (e.g., 2432) and/or drain regions (e.g., 2426). Preferably, a method can further form a silicide layer 2428, or other conductivity increasing layer, on a signal line 2406, source regions (e.g., 2432) and/or drain regions (e.g., 2426).

In this way, a signal line can be formed in a semiconductor substrate that is commonly connected to a number of CAM cells.

Figure 25:
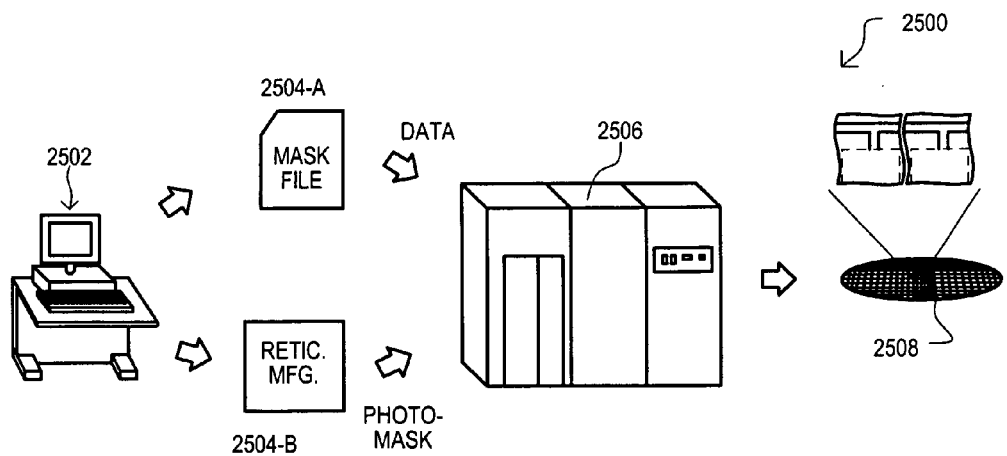
FIG. 25 is a diagram showing a method of manufacturing a CAM integrated circuit device according to one embodiment.

Referring now to FIG. 25, another method of creating a CAM device is shown in diagrammatic form, and designated by the general reference character 2500. A method can include creating patterns representing a signal line in a substrate that is commonly connected to multiple CAM cells (step 2502). Such a step can include utilizing a layout or other software to create a data file representing such a pattern.

A method 2500 can then include providing a pattern file to pattern creating device 2506, such as a stepper, or the like (path 2504-A). In the event pattern creating device 2506 utilizes a physical photomask, a method 2500 can include sending the pattern file to a photomask manufacturer (path 2504-B). A photomask manufacturer can create a corresponding photomask, which can be utilized by pattern creating device 2506.

A pattern creating device 2506 can form one or more patterns on a manufacturing substrate, which can be used to create a CAM device. As but one example, a pattern creating device 2506 can transfer a pattern onto a layer of photoresist formed on a semiconductor wafer 2508. Such layer of photoresist can then be used to transfer the pattern directly, or indirectly, onto an integrated circuit manufacturing layer formed in or on wafer 2508.

In this way, a manufacturing pattern according to embodiments described herein, and equivalents, can take various forms in a CAM device creation method.

It is understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A content addressable memory (CAM) device, comprising:
    a plurality of CAM cells, formed in a substrate, coupled to a plurality of bit lines formed in a metallization layer over the substrate, each CAM cell of the plurality of CAM cells having a respective cell length in a first direction; and
    a plurality of match lines coupled to the plurality of CAM cells,
    wherein the plurality of match lines and transistor regions of the plurality of CAM cells are formed in their entirety in a contiguous region of the substrate.

2. The CAM device of claim 1, further comprising:
    a plurality of compare data lines, formed in a second metallization layer different from the metallization layer, coupled to the plurality of CAM cells.

3. The CAM device of claim 2, wherein the second metallization layer is between the plurality of bit lines and the substrate.

4. The CAM device of claim 2, wherein:
    the plurality of match lines are formed parallel to one another in the substrate, each match line of the plurality of match lines being separated from an adjacent match line of the plurality of match lines on a first side by an isolation structure and by a row of CAM cells of the plurality of CAM cells on a second side.

5. The CAM device of claim 1, wherein:
    the substrate comprises silicon; and
    each match line of the plurality of match lines comprises:
        a portion of the substrate doped to a first conductivity type having a layer of silicide formed on a top surface of the match line.

6. The CAM device of claim 1, wherein:
    each match line of the plurality of match lines includes a portion of the substrate doped to a first conductivity type formed in a well of a second conductivity type.

7. The CAM device of claim 6, further comprising:
    a guard ring structure for each well that separates the well from adjacent portions of the substrate in a lateral direction, the guard ring structure being doped to the same conductivity type as the well, but at a higher concentration than the well.

8. The CAM device of claim 1, wherein the plurality of CAM cells includes:
    a plurality of store circuits that store data values, and
    a plurality of compare circuits that compares data values stored in the plurality of store circuits with received compare data values.

9. The CAM device of claim 8, wherein the plurality of CAM cells includes:
    a plurality of local interconnect (LIC) structures formed from a second metallization layer that provides at least one conductive connection between the plurality of store circuits and the plurality of compare circuits,
    wherein the second metallization layer is formed between the substrate and the metallization layer.

10. The CAM device of claim 1, wherein:
    the plurality of bit lines is formed in a column direction; and
    the plurality of match lines is formed in a row direction substantially orthogonal to the column direction.

11. The CAM device of claim 1, wherein the plurality of CAM cells and the plurality of match lines are formed in their entirety in the same layer.

12. A content addressable memory (CAM) device, comprising:
    a plurality of CAM cells, formed in a substrate, coupled to a plurality of bit lines, each CAM cell of the plurality of CAM cells having a cell length in a column direction; and
    a plurality of match lines coupled to the plurality of CAM cells, wherein the plurality of match lines and transistor regions of the plurality of CAM cells are formed in their entirety in a contiguous region of the substrate.

13. The CAM device of claim 12, wherein:
    the plurality of CAM cells is arranged into rows and columns, wherein each CAM cell of the plurality of CAM cells of a same column is coupled to at least one bit line of the plurality of bit lines; and
    each match line of the plurality of match lines is coupled to a row of CAM cells of the plurality of CAM cells.

14. The CAM device of claim 12, further comprising:
    a plurality of compare data lines coupled to the plurality of CAM cells in the column direction.

15. The CAM device of claim 12, wherein each CAM cell of the plurality of CAM cells includes:
    a store circuit that stores data values, and
    a compare circuit that compares data values stored in the store circuit with received compare data values.

16. The CAM device of claim 12, wherein:
the plurality of bit lines are formed in a metallization layer over the substrate.

17. The CAM device of claim 12, wherein:
each CAM cell of the plurality of CAM cells includes transistors of different conductivity types.

18. The CAM device of claim 17, wherein each CAM cell of the plurality of CAM cells includes:
  a store circuit that stores data values and includes transistors of first and second conductivity types, and
  a compare circuit that compares data values stored in the store circuit with received compare data values, wherein the compare circuit does not include transistors of the second conductivity type.

* * * * *